US009825619B1

(12) United States Patent
Arie et al.

(10) Patent No.: US 9,825,619 B1
(45) Date of Patent: Nov. 21, 2017

(54) SELF-TIMED, LOG-SPACE, VOLTAGE-CONTROLLED DELAY LINE

(71) Applicant: INTERNATIONAL BUSINESS MACHINES CORPORATION, Armonk, NY (US)

(72) Inventors: Lior Arie, Tel Avaiv (IL); Lidar Herooti, Tel Aviv (IL); Noam Jungmann, Ramat Hahayal (IL); Elazar Kachir, Haifa (IL); Uri Moshe, Haifa (IL); Hezi Shalom, Tel Aviv (IL); Israel A. Wagner, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/255,291

(22) Filed: Sep. 2, 2016

(51) Int. Cl.
*H03K 5/14* (2014.01)
*H03K 3/03* (2006.01)
*H03K 5/00* (2006.01)

(52) U.S. Cl.
CPC ............. *H03K 5/14* (2013.01); *H03K 3/0315* (2013.01); *H03K 2005/00019* (2013.01)

(58) Field of Classification Search
CPC .................. H03K 5/14; H03K 3/0315; H03K 2005/00019
USPC ......................................... 327/261, 276, 277
See application file for complete search history.

(56) References Cited

U.S. PATENT DOCUMENTS

| 7,622,979 | B2 | 11/2009 | Bhatia et al. |
| 8,294,502 | B2 | 10/2012 | Lewis |
| 2004/0246058 | A1* | 12/2004 | Chen ..................... H03L 7/0996 331/45 |
| 2005/0168260 | A1 | 8/2005 | Tomerlin et al. |

* cited by examiner

*Primary Examiner* — John Poos
(74) *Attorney, Agent, or Firm* — Heslin Rothenberg Farley & Mesiti P.C.

(57) ABSTRACT

A voltage-controlled delay line including a clipper configured to produce a clipped input voltage from an input voltage, an oscillator configured to produce a strobe pulse train that is initiated by the clipped input voltage, and a divider module configured to divide the strobe pulse train and produce an output voltage from the divided strobe pulse train.

13 Claims, 4 Drawing Sheets

SELF-TIMED, LOG-SPACE, VOLTAGE-CONTROLLED DELAY LINE

BACKGROUND

In Very-Large-Scale Integration (VLSI) chip design, there is often a need to delay a signal. This is typically accomplished by introducing delay elements, such as logic gates or wires, along a signal path, where a linear delay line having N delay elements achieves a delay of O(N). However, the more delay elements that are required, the more area that is needed, which increases routing congestion and the chances that cross-coupling and noise issues will arise.

SUMMARY

In one aspect of the invention, a voltage-controlled delay line is provided, including a clipper configured to produce a clipped input voltage from an input voltage, an oscillator configured to produce a strobe pulse train that is initiated by the clipped input voltage, and a divider module configured to divide the strobe pulse train and produce an output voltage from the divided strobe pulse train.

In another aspect of the invention, a voltage-controlled delay line method is provided, including producing a clipped input voltage from an input voltage, using the clipped input voltage to initiate a strobe pulse train, dividing the strobe pulse train, and producing an output voltage from the divided strobe pulse train.

BRIEF DESCRIPTION OF THE DRAWINGS

Aspects of the invention will be understood and appreciated more fully from the following detailed description taken in conjunction with the appended drawings in which.

DETAILED DESCRIPTION

Aspects of the invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1A:
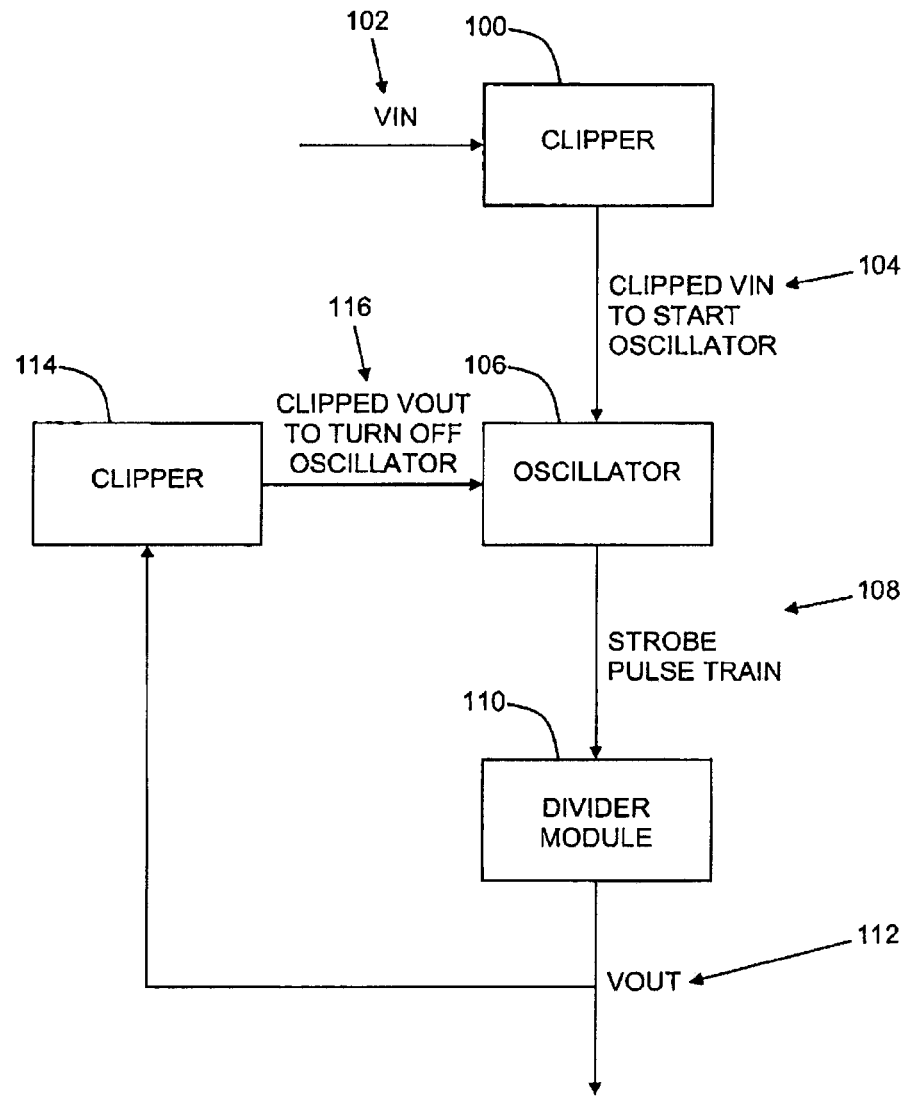
FIG. 1A is one example of a system of a block diagram of a voltage-controlled delay line, constructed and operative in accordance with an embodiment of the invention.

Reference is now made to FIG. 1A, which is one example of a block diagram of a voltage-controlled delay line, constructed and operative in accordance with an embodiment of the invention. In the system of FIG. 1A, which in one embodiment is implemented in a microprocessor using Very-Large-Scale Integration (VLSI), a clipper 100 is configured to receive an input voltage (VIN) 102 and produce a clipped input voltage (VIN) 104 from VIN 102. An oscillator 106, such as a controlled ring oscillator (RO) or other suitable oscillator, is configured to receive clipped VIN 104 and produce a strobe pulse train 108 that is initiated by clipped VIN 104. A divider module 110 is configured to receive strobe pulse train 108, divide strobe pulse train 108 one or more times, and produce an output voltage (VOUT) 112 from the divided strobe pulse train 108. The system of FIG. 1A also includes a clipper 114 that is configured to receive VOUT 112 and produce a clipped output voltage (VOUT) 116 from VOUT 112, where oscillator 106 is configured to receive clipped VOUT 116 and use clipped VOUT 116 to turn off strobe pulse train 108.

The frequency at which oscillator 106 operates should be sufficient such that the division of strobe pulse train 108 provides a sufficient number of delay periods to satisfy a given delay-line requirement. Thus, for example, if the clock speed of the environment is x, the frequency of oscillator 106 is preferably at least 10×.

Figure 1B:
FIG. 1B is a signal diagram illustrating the relationships of signals occurring during operation of the voltage-controlled delay line of FIG. 1A, operative in accordance with an embodiment of the invention.

Reference is now made to FIG. 1B, which is a signal diagram illustrating the relationships of signals occurring during operation of the voltage-controlled delay line of FIG. 1A, operative in accordance with an embodiment of the invention. In FIG. 1B, VIN 102 is shown as a waveform 102', clipped VIN 104 is shown as a waveform 104', strobe pulse train 108 is shown as a waveform 108', VOUT 112 is shown as a waveform 112', and clipped VOUT 116 is shown as a waveform 116'.

Figure 2:
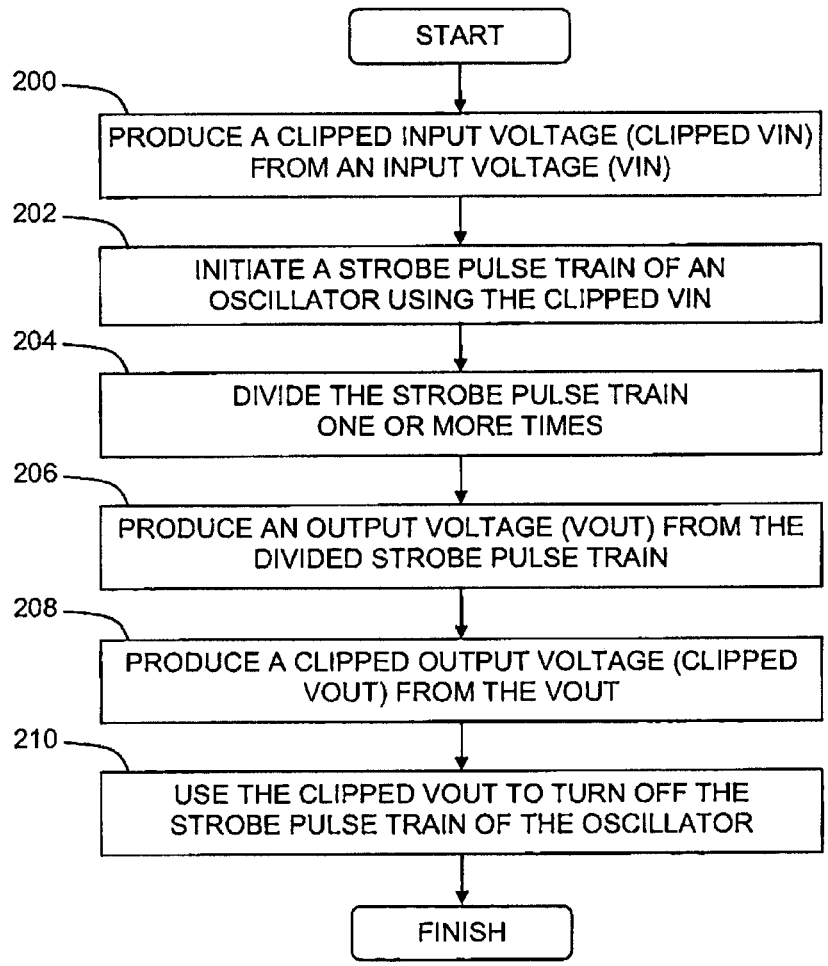
FIG. 2 is one example of a flowchart illustration of one example of a method of operation of the system of FIG. 1A, operative in accordance with an embodiment of the invention.

Reference is now made to FIG. 2 which is one example of a flowchart illustration of one example of a method of operation of the system of FIG. 1A, operative in accordance with an embodiment of the invention. In the method of FIG. 2, a clipped input voltage (VIN) is produced from an input voltage (VIN) (step 200). A strobe pulse train of an oscillator is initiated using the clipped VIN (step 202). The strobe pulse train is divided N times, where N>=1 (step 204), from which an output voltage (VOUT) is produced (step 206). By applying N stages of divide-by-two in a sequence, the output frequency is divided by 2N as compared to the input frequency. A clipped output voltage (VOUT) is produced from the VOUT (step 208), which is used to turn off the strobe pulse train of the oscillator (step 210).

Figure 3:
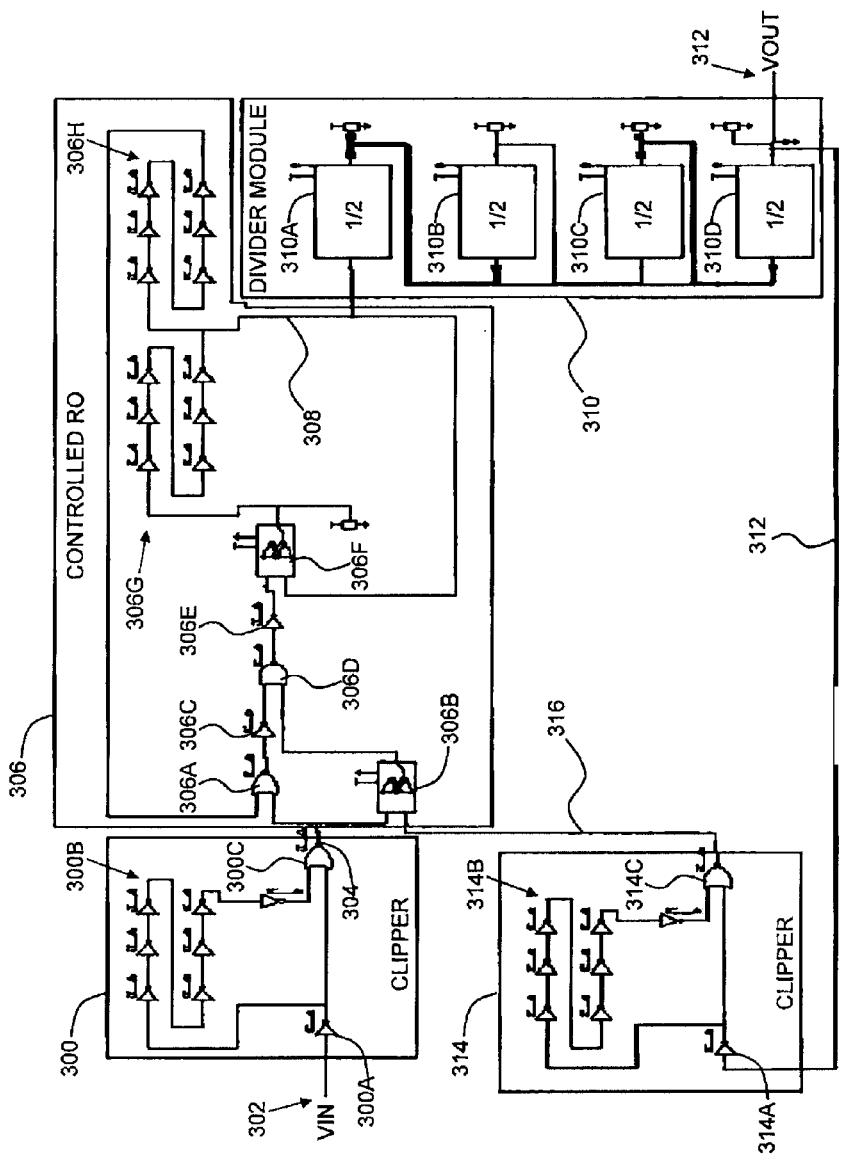
FIG. 3 is a schematic diagram of one example of an implementation of the system of FIG. 1A, constructed and operative in accordance with an embodiment of the invention.

Reference is now made to FIG. 3, which is a schematic diagram of one example implementation of the system of FIG. 1A, constructed and operative in accordance with an embodiment of the invention. In the implementation of FIG.

3, a clipper 300 is configured to receive an input voltage (VIN) 302 and produce a clipped input voltage (VIN) 304 from VIN 302. In clipper 300, VIN 302 is received at an inverter 300A, whose output voltage is routed to a line of inverters 300B and a NOR gate 300C. The output voltage of the line of inverters 300B is also routed to NOR gate 300C. NOR gate 300C produces clipped VIN 304.

A controlled ring oscillator (RO) 306 is configured to receive clipped VIN 304 as a trigger, and produce a strobe pulse train 308 that is initiated by clipped VIN 304. In controlled RO 306, clipped VIN 304 is received at both a NOR gate 306A and a set/reset (SR) latch 306B. Clipped VIN 304 is routed from NOR gate 306A to an inverter 306C, and then to a NAND gate 306D. Clipped VIN 304 is routed from SR latch 306B to NAND gate 306D. The output of NAND gate 306D is routed to an inverter 306E and then to an SR latch 306F. The output of SR latch 306F is routed to a line of inverters 306G which produces strobe pulse train 308. A line of inverters 306H receives strobe pulse train 308, as does SR latch 306F. The output of line of inverters 306H is then routed back to NOR gate 306A, thus closing the feedback loop that produces the ring oscillator.

A divider module 310 is configured to receive and divide strobe pulse train 308 via a set of serially-interconnected dividers 310A, 310B, 310C, and 310D, such as where each of dividers 310A, 310B, 310C, and 310D is configured as a divider-by-two, which then produces an output voltage (VOUT) 312, which is a divided version of the strobe pulse train 308.

A clipper 314 is configured to receive VOUT 312 and produce a clipped output voltage (VOUT) 316 from VOUT 312. In clipper 314, VOUT 312 is received at an inverter 314A, whose output voltage is routed to a line of inverters 314B and a NOR gate 314C. The output voltage of the line of inverters 314B is also routed to NOR gate 314C. NOR gate 314C produces clipped VOUT 316. Controlled RO 306 is configured to receive clipped VOUT 316 at the "RESET" input of SR latch 306B, which turns off strobe pulse train 308.

It will be appreciated that aspects of the invention achieve an O(N) delay using an O(log N)-area circuit having log N dividers. Furthermore, as aspects of the invention do not require an external clock, creating its own time base instead, delay precision is independent of a system clock cycle.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A voltage-controlled delay line comprising:
   a clipper configured to produce a clipped input voltage from an input voltage;
   an oscillator configured to produce a strobe pulse train that is initiated by the clipped input voltage;
   a divider module configured to divide the strobe pulse train and produce an output voltage from the divided strobe pulse train; and
   a second clipper configured to produce a clipped output voltage from the output voltage, wherein the oscillator is configured to use the clipped output voltage to turn off the strobe pulse train.

2. The voltage-controlled delay line according to claim 1, wherein the oscillator includes a first set-reset latch configured to receive the clipped input voltage and initiate the strobe pulse train based on receipt of the clipped input voltage.

3. The voltage-controlled delay line according to claim 2, wherein the oscillator includes a second set-reset latch configured to receive a clipped output voltage produced from the output voltage and cause the first set-reset latch to turn off the strobe pulse train.

4. The voltage-controlled delay line according to claim 1, wherein the divider module is configured to divide the strobe pulse train multiple times.

5. The voltage-controlled delay line according to claim 1, wherein the divider module includes a plurality of dividers.

6. The voltage-controlled delay line according to claim 5, wherein the plurality of dividers are serially-interconnected.

7. The voltage-controlled delay line according to claim 1, wherein the clipper, the oscillator, and the divider module are implemented in a microprocessor.

8. The voltage-controlled delay line according to claim 1, wherein the oscillator is a controlled ring oscillator.

9. A voltage-controlled delay line method comprising:
   producing a clipped input voltage from an input voltage;
   using the clipped input voltage to initiate a strobe pulse train;
   dividing the strobe pulse train;
   producing an output voltage from the divided strobe pulse train;
   producing a clipped output voltage from the output voltage; and
   using the clipped output voltage to turn off the strobe pulse train.

10. The voltage-controlled delay line method according to claim 9, wherein the using the clipped input voltage comprises receiving the clipped input voltage at a first set-reset latch configured to initiate the strobe pulse train based on receipt of the clipped input voltage.

11. The voltage-controlled delay line method according to claim 10, further comprising:
   receiving at a second set-reset latch a clipped output voltage produced from the output voltage, wherein the second set-reset latch is configured to cause the first set-reset latch to turn off the strobe pulse train based on receipt of the clipped output voltage.

12. The voltage-controlled delay line method according to claim 9, wherein the dividing comprises dividing the strobe pulse train multiple times.

13. The voltage-controlled delay line method according to claim 9, wherein the dividing comprises dividing the strobe pulse train using a plurality of dividers.

* * * * *